(12) United States Patent
Shih et al.

(10) Patent No.: US 9,842,865 B2
(45) Date of Patent: Dec. 12, 2017

(54) MASK PLATE, METHOD OF MANUFACTURING ARRAY SUBSTRATE, AND ARRAY SUBSTRATE

(71) Applicant: SHENZHEN CHINA STAR OPTOELECTRONICS TECHNOLOGY CO., LTD., Shenzhen (CN)

(72) Inventors: Ming Hung Shih, Shenzhen (CN); Jiali Jiang, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 14/416,831

(22) PCT Filed: Aug. 5, 2014

(86) PCT No.: PCT/CN2014/083742
§ 371 (c)(1),
(2) Date: Jan. 23, 2015

(87) PCT Pub. No.: WO2016/008182
PCT Pub. Date: Jan. 21, 2016

(65) Prior Publication Data
US 2017/0117307 A1 Apr. 27, 2017

(30) Foreign Application Priority Data
Jul. 18, 2014 (CN) .......................... 2014 1 0344993

(51) Int. Cl.
*H01L 27/12* (2006.01)
*G03F 1/38* (2012.01)
*G02F 1/1362* (2006.01)

(52) U.S. Cl.
CPC ............ *H01L 27/1288* (2013.01); *G03F 1/38* (2013.01); *H01L 27/1248* (2013.01);
(Continued)

(58) Field of Classification Search
CPC ........................ H01L 27/1288; H01L 27/1248
See application file for complete search history.

(56) References Cited

U.S. PATENT DOCUMENTS

| | | | |
|---|---|---|---|
| 8,101,442 B2 | 1/2012 | Miyairi et al. | |
| 2012/0314154 A1 | 12/2012 | Zhang | |
| 2014/0009709 A1 | 1/2014 | Lim et al. | |

FOREIGN PATENT DOCUMENTS

| | | |
|---|---|---|
| CN | 1664685 A | 9/2005 |
| CN | 101179081 A | 5/2008 |

(Continued)

OTHER PUBLICATIONS

International Search Report and Written Opinion (Forms PCT/ISA/210, PCT/ISA/220 and PCT/ISA/237) dated Apr. 21, 2015, by the State Intellectual Property Office of China in corresponding International Application No. PCT/CN2014/083742. (13 pages).

*Primary Examiner* — Amar Movva
(74) *Attorney, Agent, or Firm* — Buchanan Ingersoll & Rooney PC

(57) ABSTRACT

The present disclosure discloses a mask plate, a method of manufacturing a corresponding array substrate, and an array substrate, used in the technical field of liquid crystal displays. The mask plate comprises a non-transparent area and a transparent area. The non-transparent area has an intermediate vertical trunk, an intermediate horizontal trunk, and branches extending from the intermediate vertical trunk and the intermediate horizontal trunk. The intermediate vertical trunk and the intermediate horizontal trunk form certain angles with the branches, respectively. The transparent area has a first transparent portion provided between the (Continued)

branches. The first transparent portion is provided with an optical interference unit, which is used for processing light with a first intensity into light with a second intensity, the first intensity being higher than the second intensity. A second transparent portion is used for directly introducing light with the first intensity to form a contact hole on an array substrate to be formed through the mask plate. The present disclosure further comprises a method of manufacturing an array substrate using the mask plate, and an array substrate thus manufactured. According to the present disclosure, both the aperture ratio of a pixel unit and transmittance of the liquid crystal panel can be improved.

18 Claims, 4 Drawing Sheets

(52) U.S. Cl.
CPC ...... *G02F 1/1362* (2013.01); *G02F 1/136286* (2013.01); *G02F 2201/123* (2013.01)

(56) References Cited

FOREIGN PATENT DOCUMENTS

| | | |
|---|---|---|
| CN | 101527284 | 9/2009 |
| CN | 102200664 A | 9/2011 |
| CN | 103337522 | 10/2013 |

… (1)

MASK PLATE, METHOD OF MANUFACTURING ARRAY SUBSTRATE, AND ARRAY SUBSTRATE

CROSS-REFERENCE TO RELATED APPLICATIONS

The present application claims benefit of Chinese patent application CN 201410344993.4, entitled "Mask plate, method of manufacturing array substrate, and array substrate" and filed on Jul. 18, 2014, the entirety of which is incorporated herein by reference.

FIELD OF THE INVENTION

The present disclosure relates to the technical field of liquid crystal displays, in particular to a mask plate, a method of manufacturing an array substrate with the mask plate, and a corresponding array substrate.

BACKGROUND OF THE INVENTION

A conventional High Vertical Alignment (HVA) pixel electrode is structured in form of fine slits, in which a slit portion is provided with no pixel electrode and thus presents a relatively poor control over an electric field and furthermore a relatively poor control over liquid crystal molecules. As a result, dark fringes would occur in this portion, causing loss of liquid crystal efficiency and hence loss of transmittance of a liquid crystal display panel. In order to improve the transmittance of the liquid crystal display panel, proposed is a new pixel electrode having a three-dimensional structure. The three-dimensional pixel electrode covers an opening area of a pixel unit.

During manufacture of an array substrate having the aforementioned three-dimensional pixel electrode, a contact hole and an insulation layer in the three-dimensional pixel electrode are usually etched simultaneously. That is, one mask plate is used for forming both the contact hole and the three-dimensional structure of the pixel electrode at the same time. As such, the costs of the mask plate and processing time can be effectively saved. However, a portion of the insulation layer in the three-dimensional pixel electrode will be entirely etched away. If, at this time, a shielding electrode is added in order to improve the aperture ratio of the liquid crystal display panel, the shielding electrode might contact the pixel electrode. Therefore, addition of a shielding electrode is impossible in this case, and the aperture ratio of the liquid crystal display panel would be reduced.

In view of the above, there is an urgent need of a mask plate that can both form a three-dimensional pixel electrode and improve the aperture ratio of the liquid crystal display panel, a method for manufacturing a corresponding array substrate, and an array substrate.

SUMMARY OF THE INVENTION

To solve the above problems, the present disclosure provides a mask plate that can both form a three-dimensional pixel electrode and improve the aperture ratio of the liquid crystal display panel, a method for manufacturing a corresponding array substrate, and an array substrate.

According to one aspect of the present disclosure, a mask plate is provided, comprising:

a non-transparent area, which has an intermediate vertical trunk, an intermediate horizontal trunk, and branches extending from the intermediate vertical trunk and the intermediate horizontal trunk, the intermediate vertical trunk and the intermediate horizontal trunk forming angles with the branches, respectively; and a transparent area, which has a first transparent portion provided between the branches, wherein the first transparent portion is provided with an optical interference unit, which is used for processing light with a first intensity into light with a second intensity, the first intensity being higher than the second intensity.

According to one embodiment of the present disclosure, the transparent area further has a second transparent portion, which is used for directly introducing light with the first intensity to form a contact hole on an array substrate to be formed through the mask plate.

According to one embodiment of the present disclosure, the optical interference unit is in the form of a grid, a grate, or a sheet.

According to one embodiment of the present disclosure, the optical interference unit is arranged in a middle position of the first transparent portion and penetrates the first transparent portion.

According to one embodiment of the present disclosure, the optical interference unit is made of a non-transparent or semi-transparent material.

According to another aspect of the present disclosure, a method of manufacturing an array substrate is further provided, comprising forming an insulation structure with the mask plate according to the first aspect of the present disclosure.

According to one embodiment of the present disclosure, formation of a first metal conductive layer further comprises forming a shielding electrode.

According to still another embodiment of the present disclosure, an array substrate is further provided, comprising:

a base;

a plurality of pixel units formed on the base, the plurality of pixel units each including a pixel electrode arranged in an opening area; and an insulation structure arranged between the pixel electrode and the base, wherein the insulation structure is etched through the mask plate according to either of the above aspects of the present disclosure.

According to one embodiment of the present disclosure, the insulation structure has an intermediate vertical trunk, an intermediate horizontal trunk, and branches extending from the intermediate vertical trunk and the intermediate horizontal trunk, the intermediate vertical trunk and the intermediate horizontal trunk forming angles with the branches, respectively, and a groove having a bottom surface made of an insulation material is provided between two adjacent branches.

According to one embodiment of the present disclosure, a shielding electrode is further provided between a data line and the pixel electrode in the same layer with a gate line, so as to shielding electric signals between the data line and the pixel electrode.

The present disclosure has brought about the following beneficial effects.

Through arrangement of an optical interference unit in the first transparent portion of the transparent area on the mask plate, the insulation material on the array substrate corresponding to this portion cannot be entirely etched away. The non-etched insulation material on the array substrate corresponding to this portion and the insulation material on the array substrate corresponding to the non-transparent area of the mask plate form an insulation structure. Existence of this insulation structure allows the arrangement of a shielding lectrode between the pixel electrode and the data line, thus shortening the distance therebetween. The above design improves both the aperture ratio of the pixel unit and the transmittance of the liquid crystal display panel.

Other features and advantages of the present disclosure will be illustrated and become partly obvious in the following description, and be understood through implementation of the present disclosure. The purposes and other advantages of the present disclosure will be achievable or obtainable through the structures as indicated in the following description, claims, and drawings.

BRIEF DESCRIPTION OF THE DRAWINGS

In order to explain the technical solution of the embodiments of the present disclosure or the technical solution in the prior art in a clearer manner, the accompanying drawings used in describing the prior art or the embodiments of the present disclosure are briefly introduced as follows, in which.

DETAILED DESCRIPTION OF THE EMBODIMENTS

The present disclosure will be explained by reference to the following detailed description of embodiments taken in connection with the accompanying drawing figures, whereby it can be understood more readily how to solve the technical problem by the technical means according to the present disclosure and achieve the technical effects thereof, and thus the technical solution according to the present disclosure can be implemented. It is important to note that as long as there is no conflict, combinations of the above-described embodiments and technical features therein, and technical solutions obtained in this manner are intended to be within the scope of the present disclosure.

In addition, the steps as illustrated in the flow chart of the accompanying drawings can be executed in a computer system under, for example, a set of computer-executable instructions. Furthermore, despite the logical order indicated in the flow chart, the steps as shown or described can, in some circumstances, be executed in an order different from the logical order shown in the flow chart.

Figure 1:
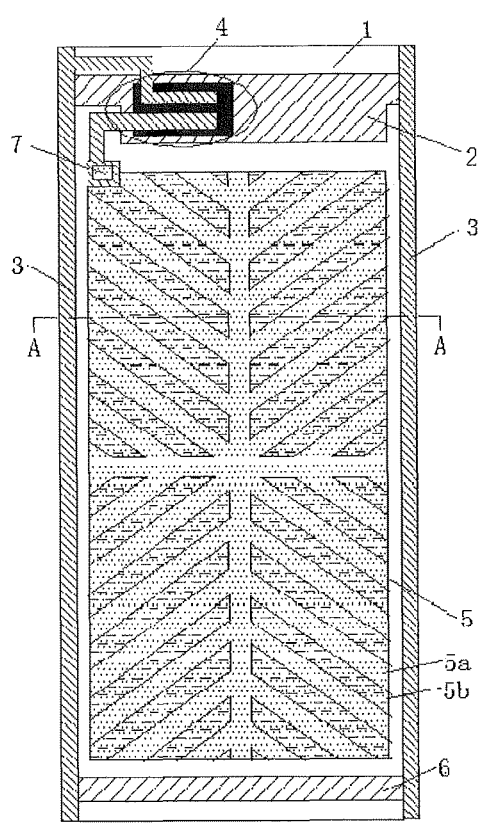
FIG. 1 shows a planar diagram of an existing array substrate having a three-dimensional pixel electrode.

FIG. 1 shows a planar diagram of an existing array substrate having a three-dimensional pixel electrode. As shown in FIG. 1, the array substrate comprises a base 1 and a plurality of pixel units. Each pixel unit has a gate line 2, a data line 3, a TFT 4, a pixel electrode 5, and a common electrode line 6 that are provided on the base 1. The gate line 2 is arranged in parallel with the common electrode line 6, and both the gate line 2 and the common electrode line 6 are perpendicular to the data line 3. The TFT 4 is arranged on the gate line 2, and has its gate, source, and drain electrically connected to the gate line 2, the data line 3, and the pixel electrode 5, respectively. In one arrangement, the drain of the TFT 4 is connected to the pixel electrode 5 via a contact hole 7. The pixel electrode 5 is arranged in an opening area which is formed through being surrounded by the gate line 2, the data line 3, and the common electrode line 6.

A pixel electrode layer as shown in FIG. 1 is supported by a fishbone-shaped insulation structure. This insulation structure has an intermediate vertical trunk, an intermediate horizontal trunk, and branches extending from the intermediate vertical trunk and the intermediate horizontal trunk respectively. The intermediate vertical trunk, the intermediate horizontal trunk, and the branches form convex insulation portions, and are termed as convex strips 5a along with the pixel electrode layer that has been coated. A groove 5b is formed between any two adjacent convex strips. In an existing pixel electrode structure, the groove 5b only has a pixel electrode layer at the bottom thereof, such that the coated pixel electrode layer directly contacts the base 1.

Figure 2:
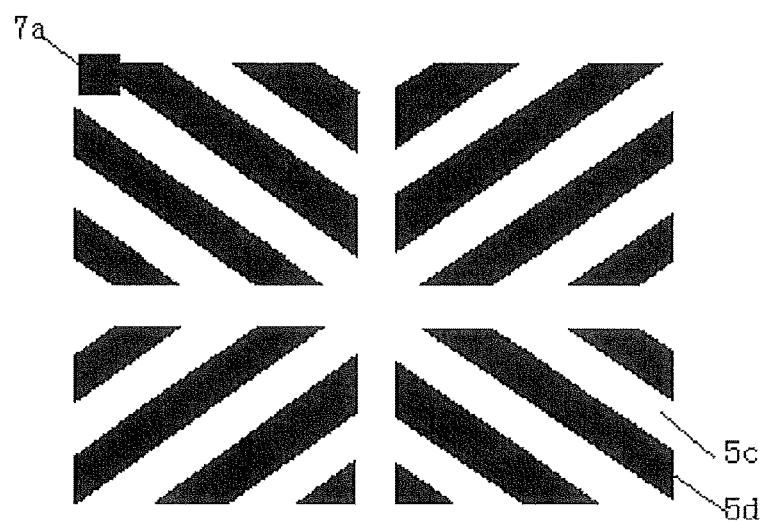
FIG. 2 schematically shows a partial view of a mask plate correspondingly used in forming the pixel electrode as shown in FIG. 1.

FIG. 2 shows a pattern of a mask plate correspondingly used in forming the pixel electrode as shown in FIG. 1. Under a condition when a positive photoresist material is used, a non-transparent area 5c, a first transparent portion 5d, and a second transparent portion 7a as shown in FIG. 2 are used for forming the convex strip 5a, the groove 5b, and the contact hole 7 on the array substrate, respectively.

Figure 3:
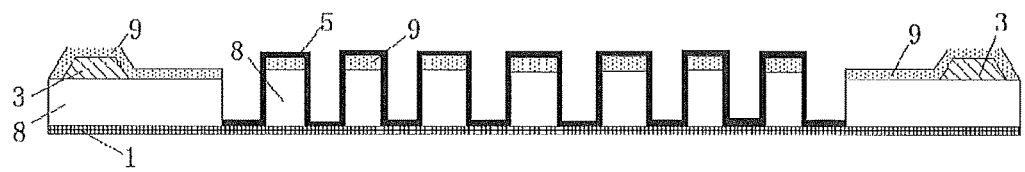
FIG. 3 schematically shows a cross-section view of FIG. 1 along line A-A.

FIG. 3 schematically shows a cross-section view of FIG. 1 along line A-A. As illustrated in FIG. 3, a surface of the entire insulation structure is covered with the pixel electrode layer. That is, the pixel electrode layer supported by the insulation structure constitutes the pixel electrode 5. A gate insulation layer 8 covers the base 1, while a deposited passivation layer 9 covers surfaces of the data line 3 and the gate insulation layer 8.

During manufacture of the array substrate as described above, the mask plate as shown in FIG. 2 can be used for forming the structure of the contact hole and the three-dimensional structure of the pixel electrode at the same time. That is, the contact hole and the fishbone-shaped insulation structure can be prepared in one and the same procedure, using one mask plate. Although costs of the mask plate and processing time can thus be effectively reduced, an insulation material layer between two adjacent branches might be entirely etched away during the procedure. Thus, a transparent conductive material might directly contact the base 1 when being coated to form the pixel electrode layer. As illustrated in FIG. 3, the insulation layer between the base 1 and the pixel electrode layer in the grooves is completely etched away. As a result, the pixel electrode 5 contacts the base 1.

Moreover, in the procedure of designing a liquid crystal display panel, in order to increase the aperture ratio of a pixel unit, a shielding structure, such as a shielding electrode, can generally be provided between the pixel electrode 5 and the data line 3. The shielding electrode can be used for shielding interference of electrical signals between the pixel electrode 5 and the data line 3, with which the distance therebetween can be reduced. As such, the pixel electrode 5 can be arranged as close to the data line 3 as possible, thus increasing the opening area of the pixel unit to the largest extent.

However, the shielding electrode and the gate line are usually formed in one and the same procedure. Therefore, if the insulation layer in the grooves of the three-dimensional pixel electrode is entirely etched away, the pixel electrode 5 covering the insulation layer in the grooves would contact the base 1. Since the shielding electrode directly contacts the base 1 also and is located between the pixel electrode 5 and the data line 3, it has a chance to contact the pixel electrode layer on the grooves with no bottom. During the manufacture procedure, the pixel electrode layer may electrically contact the shielding electrode when translations occur between different layers, which is not allowed in practice. As one solution to the above problem, a layer difference can be formed between the pixel electrode and the shielding electrode. In the following, the technical solution of forming the layer difference in the manufacture of an array substrate using a modified mask plate will be explained in details.

A mask plate of the present disclosure can comprise a non-transparent area 5c and a transparent area. The non-transparent area 5c can be the same as that shown in FIG. 2, also including an intermediate vertical trunk, an intermediate horizontal trunk, and branches extending from the intermediate vertical trunk and the intermediate horizontal trunk. The intermediate vertical trunk and the intermediate horizontal trunk can form certain angles with the branches, respectively. In the mask plate, the non-transparent area can form a fishbone-shaped pattern on the whole.

The transparent area can comprise a first transparent portion 5d and a second transparent portion 7a. The first transparent portion 5d can be arranged between the two adjacent branches of the non-transparent area 5c, and can be provided with an optical interference unit therein. With the optical interference unit, light with a first intensity can be, after passing through the first transparent portion 5d, changed into light with a second intensity, the first intensity being higher than the second intensity. The above optical interference unit can be made of a non-transparent material, and can also be made of a semi-transparent material as required.

Figure 4:
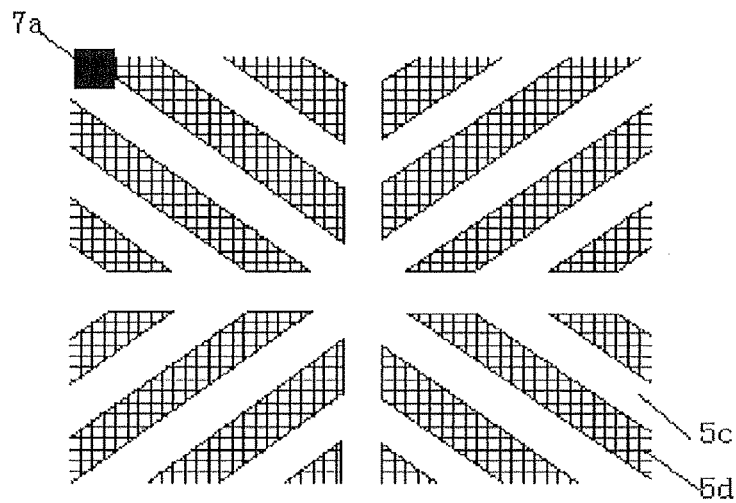
FIG. 4 schematically shows a partial view of one embodiment of the mask plate according to the present disclosure.

In one embodiment of the present disclosure, the optical interference unit can be arranged in the form of a grid as shown in FIG. 4, wherein light can irradiate the array substrate to be etched through the grid. Thus, a location on the array substrate that corresponds to a shading portion of the grid can also be irradiated, so that the insulation layer on the array substrate that corresponds to this location can be etched away. However, since the light passing through the optical interference unit has a reduced intensity, the insulation material can still partly remain on the location corresponding to the shading portion of the grid of the mask plate within the same etching duration. The size of the grid can be arranged as required, and is substantially dependent on the thickness of the insulation material to be retained, the time period of photo etching, and the intensity of the light exerted.

Figure 5:
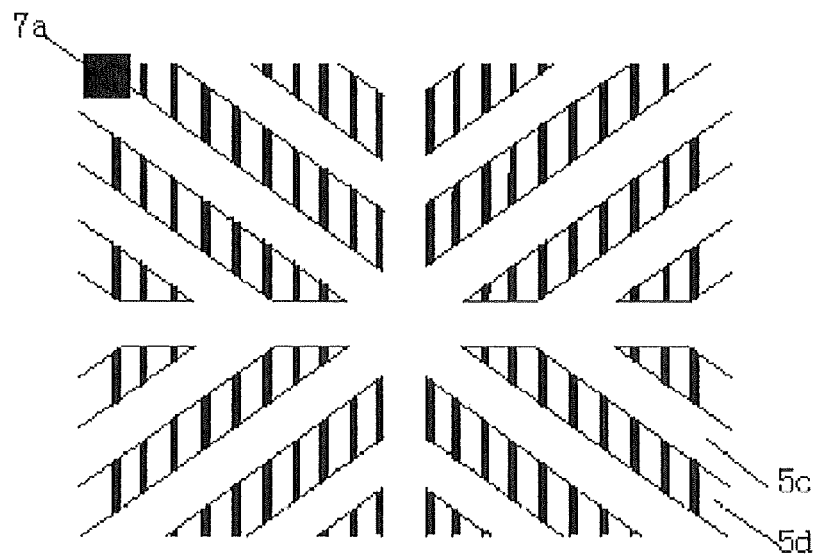
FIG. 5 schematically shows a partial view of another embodiment of the mask plate according to the present disclosure.

In another embodiment of the present disclosure, the optical interference unit can be arranged in the form of a grate as shown in FIG. 5, wherein light can irradiate the array substrate to be etched through intervals on the grate. Thus, a location on the array substrate that corresponds to a shading portion of the grate can also be irradiated, so that the insulation layer on the array substrate that corresponds to this location can be etched away. Similarly with the example of a grid as described above, since the light passing through the optical interference unit has a reduced intensity, the insulation material can still partly remain on the location corresponding to the shading portion of the grate of the mask plate within the same etching duration. The distance between two adjacent grate strips can be arranged as required, and is substantially dependent on the thickness of the insulation material to be retained, the time period of photo etching, and the intensity of the light exerted.

The optical interference unit, either in the form of a grid or a grate, can be configured as contacting the branches at both sides thereof so as to fully occupy the first transparent portion 5d, as shown in FIGS. 4 and 5. Nevertheless, in practice, the optical interference unit, either in the form of a grid or a grate, can also be arranged between two adjacent branches merely, and thus spaced from both of the two opposite sides of the branches.

Figure 6:
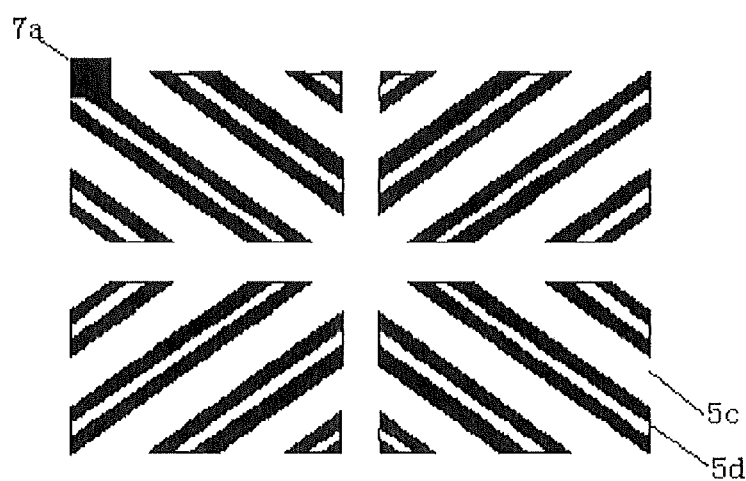
FIG. 6 schematically shows a partial view of still another embodiment of the mask plate according to the present disclosure.

In another embodiment of the present disclosure, the optical interference unit can further be arranged in the form of a sheet along the length direction of the transparent portion, as shown in FIG. 6, wherein light can irradiate the array substrate to be etched through the transparent portions at two sides of the sheet structure. Thus, a location on the array substrate that corresponds to the sheet structure can also be irradiated, so that the insulation layer on the array substrate that corresponds to the location can be etched. However, the light passing through the optical interference unit has a reduced intensity, the insulation material on a location of the array substrate corresponding to the sheet structure of the optical interference unit would not be completely etched away within the same etching duration at the same initial intensity. As a result, the insulation material with a certain thickness can remain as compared with the case in which no optical interference unit is provided.

In one specific example, when the optical interference unit is in the form of a sheet and arranged as penetrating two adjacent branches, in order to prevent the light passing through the optical interference unit from having such a large intensity that the insulation layer corresponding to this portion is completely etched and thus the base is exposed, the sheet-like optical interference unit can also be spaced from one side of an adjacent branch at a distance in a range from 0.2 µm to 0.5 µm. In practice, the etching depth of the insulation material on a corresponding array substrate can also be controlled by altering the effective transmission area of the optical interference unit.

The optical interference unit is, of course, not limited to the above forms, but intended to comprise any form that can impose an influence on the intensity of light.

The second transparent portions 7a corresponding to FIGS. 4, 5, and 6 respectively are arranged as transparent, and can directly introduce the initial light with a first intensity, so as to form contact holes on the array substrates correspondingly.

A method of manufacturing an array substrate by the mask plate of the present disclosure can mainly comprise the following steps.

At the outset, a first metal conductive layer can be formed by depositing a first layer of metal film on a base, during which, a gate line, a common electrode line, and a shielding electrode that is connected to the common electrode line can be formed.

Next, a first insulation material and a semi conductive material can be deposited on the first metal conductive layer to form an intermediate layer.

Afterward, a second metal conductive layer can be formed by depositing a second metal film on the intermediate layer, during which a source and a drain of a TFT can be further formed.

Subsequently, the above mask plate can be used to form an insulation structure on the second metal conductive layer and the intermediate layer that is exposed. In one embodiment of the present disclosure, under a condition when a positive photoresist material is employed, the insulation material on the array substrate corresponding to the non-transparent area of the mask plate is not etched, and thus forms a convex structure. A transparent area on the mask plate can be arranged as comprising a first transparent portion and a second transparent portion. The first transparent portion can be provided with an optical interference unit. When light with a first intensity passes through the optical interference unit, it becomes light with a second intensity which is lower than the first intensity. Since the light that passes through the first transparent portion has a reduced intensity, the etching depth into the array substrate corresponding to the first transparent portion would become lower, and thus the insulation material on the substrate corresponding to the first transparent portion would not be completely etched away. Hence, a concave structure would form accordingly. Therefore, the insulation material having the convex structure and the concave structure can form a three-dimensional insulation structure. The second transparent portion can directly introduce the light with the first intensity to form a contact hole on the array substrate accordingly.

Finally, a transparent conductive material can be coated on the insulation structure so as to form a pixel electrode.

Figure 7:
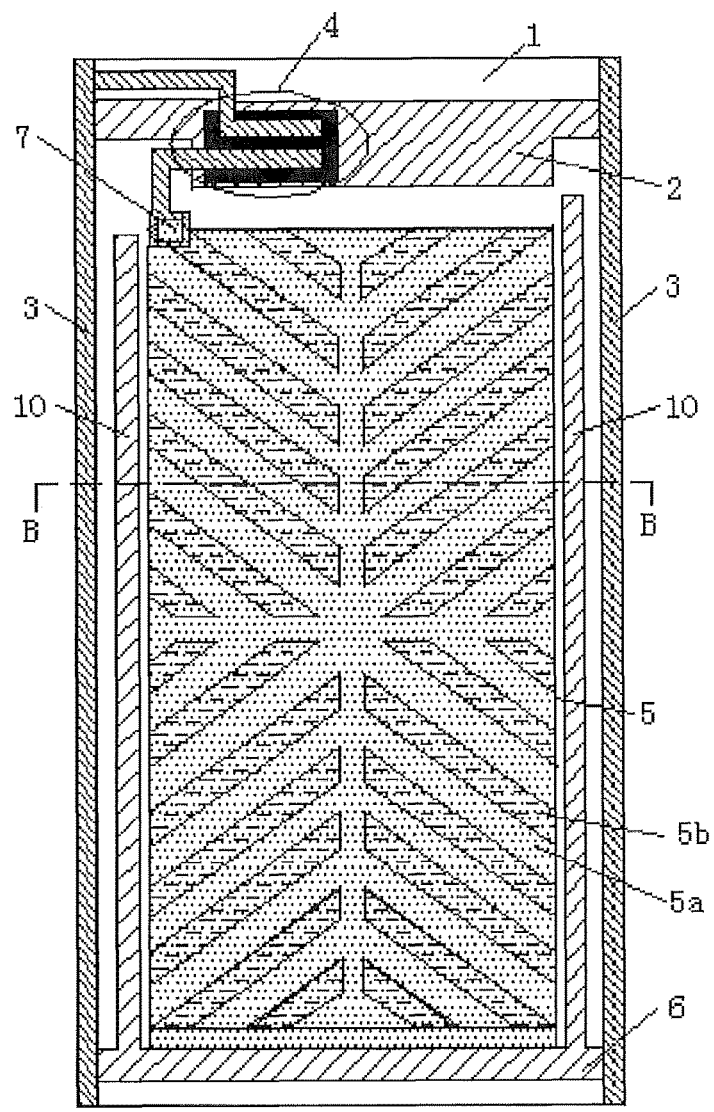
FIG. 7 shows a planar diagram of one embodiment of an array substrate manufactured using either of the mask plates as shown in FIGS. 4 and 5.

FIG. 7 shows a planar diagram of one embodiment of an array substrate manufactured by the above method using the above mask plate.

As shown in FIG. 7, the array substrate can comprise a base 1 and a plurality of pixel units. Each pixel unit can have a gate line 2, a data line 3, a TFT 4, a pixel electrode 5, and a common electrode line 6 that are provided on the base 1. The gate line 2 can be arranged in parallel with the common electrode line 6, and both the gate line 2 and the common electrode line 6 can be perpendicular to the data line 3. The TFT 4 can be arranged on the gate line 2, and have its gate, source, and drain electrically connected to the gate line 2, the data line 3, and the pixel electrode 5, respectively. The drain of the TFT 4 can be connected to the pixel electrode 5 via a contact hole 7. The TFT 4 can be arranged on the gate line so as to avoid from occupying an opening area of the pixel unit, which is beneficial for improving the aperture ratio of the pixel unit. The pixel electrode 5 can be arranged in the opening area which can be formed through being surrounded by the gate line 2, the common electrode line 6, and the data line 3. A shielding electrode 10 can be arranged between the pixel electrode 5 and each of the data lines 3 located at two sides of the pixel electrode.

An insulation structure can be arranged between the pixel electrode 5 and the base 1. The insulation structure can have an intermediate vertical trunk, an intermediate horizontal trunk, and branches extending from the intermediate vertical trunk and the intermediate horizontal trunk respectively. The trunks and the branches can form a fishbone-shaped structure, the shape of which corresponds to the pattern of the non-transparent area of the above mask plate. For the sake of convenience, the terms of "trunk" and "branch" are used for both the mask plate and the insulation structure. However, those skilled in the art, upon reading the description of the present disclosure, can obviously understand the specific meanings thereof in different circumstances.

In the insulation structure, the angle between the trunk and the branch can range from 30° to 60°. The branch portion and the pixel electrode material that covers the branch portion can form a convex strip 5a, and a groove 5b can be formed between two adjacent convex strips 5a. The convex strips 5a and the grooves 5b can be alternately arranged, and both have a width, for example, in a range from 0.6 μm to 1.6 μm.

Figure 8:
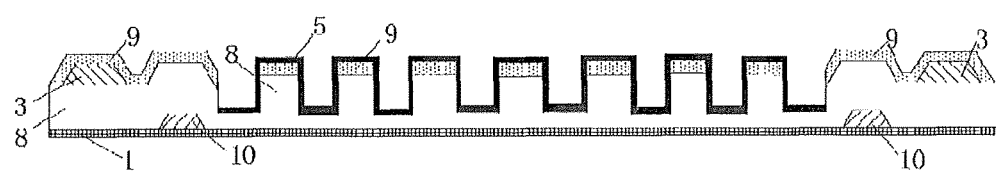
FIG. 8 schematically shows a cross-section view of FIG. 7 along line B-B.

The structure of the pixel electrode of the present disclosure will be further explained in detail with reference to FIG. 8, which schematically shows a cross-section view of FIG. 7 along line B-B. In FIG. 8, the pixel electrode 5 and the base 1 are entirely separated from each other by the insulation structure.

From the cross-section view, it can be seen that the fishbone-shaped insulation structure is of three-dimensional, and can comprise convex branches and trunks, and concave portions between and among the branches. The pixel electrode material coated on the insulation structure and the convex portions can form the above convex strips, while the pixel electrode material coated on insulation structure and the concave portions can form the grooves.

The insulation material between the base and the pixel electrode on the surface of the groove can provide a layer difference between the shielding electrode 10 and the pixel electrode 5 that is located on the surface of the groove. Even if a positional deviation may occur among different layers in the manufacture procedures, the shielding electrode 10 can be prevented from contacting the pixel electrode 5. Hence, according to the present disclosure, the shielding electrode 10 can be arranged between the data line 3 and the pixel electrode 5, so as to effectively shielding signal interference therebetween. As such, the distance between the data line 3 and the pixel electrode 5 can be arranged as small as possible. Since the pixel electrode 5 can be arranged close to the data line 3, the opening area of the pixel unit can be improved, thus further improving the aperture ratio of the pixel unit.

While the embodiments of the present disclosure are described above, the description should not be construed as limitations of the present disclosure, but merely as embodiments for readily understanding the present disclosure. Anyone skilled in the art, within the spirit and scope of the present disclosure, can make amendments or modification to the implementing forms and details of the embodiments. Hence, the scope of the present disclosure should be subjected to the scope defined in the claims.

LIST OF REFERENCE NUMBERS 1. base;
2. gate line;
3. data line;
4. thin film transistor (TFT);
5. pixel electrode;
5a. convex strip;
5b. groove;
5c. non-transparent area;
5d. first transparent portion;
6. common electrode line;
7. contact hole;
7a. second transparent portion;
8. gate insulation layer;
9. deposited passivation layer; and
10. shielding electrode.

The invention claimed is:

1. A mask plate, comprising:
   a non-transparent area, which has an intermediate vertical trunk, an intermediate horizontal trunk, and branches extending from the intermediate vertical trunk and the intermediate horizontal trunk, the intermediate vertical trunk and the intermediate horizontal trunk forming angles with the branches, respectively; and
   a transparent area, which has a first transparent portion provided between the branches,
   wherein the first transparent portion is provided with an optical interference unit, which is used for processing light with a first intensity into light with a second intensity, the first intensity being higher than the second intensity.

2. The mask plate of claim 1, wherein the transparent area further has a second transparent portion, which is used for directly introducing light with the first intensity to form a contact hole on an array substrate to be formed through the mask plate.

3. The mask plate of claim 2, wherein the optical interference unit is in the form of a grid, a grate, or a sheet.

4. The mask plate of claim 3, wherein the optical interference unit is arranged in a middle position of the first transparent portion and penetrates the first transparent portion.

5. The mask plate of claim 1, wherein the optical interference unit is made of a non-transparent or semi-transparent material.

6. A method of manufacturing an array substrate, comprising forming an insulation structure with a mask plate, the mask plate including:
   a non-transparent area, which has an intermediate vertical trunk, an intermediate horizontal trunk, and branches extending from the intermediate vertical trunk and the intermediate horizontal trunk, the intermediate vertical trunk and the intermediate horizontal trunk forming angles with the branches, respectively; and
   a transparent area, which has a first transparent portion provided between the branches,
   wherein the first transparent portion is provided with an optical interference unit, which is used for processing light with a first intensity into light with a second intensity, the first intensity being higher than the second intensity.

7. The method of claim 6, wherein the transparent area of the mask plate further has a second transparent portion, which is used for directly introducing light with the first intensity to form a contact hole on an array substrate to be formed through the mask plate.

8. The method of claim 7, wherein the optical interference unit is in the form of a grid, a grate, or a sheet.

9. The method of claim 8, wherein the optical interference unit is arranged in a middle position of the first transparent portion and penetrates the first transparent portion.

10. The method of claim 6, wherein the optical interference unit is made of a non-transparent or semi-transparent material.

11. The method of claim 6, further comprising forming a shielding electrode during formation of a first metal conductive layer.

12. An array substrate, comprising:
    a base;
    a plurality of pixel units formed on the base, the plurality of pixel units each including a pixel electrode arranged in an opening area, and an insulation structure arranged between the pixel electrode and the base,
    wherein the insulation structure is etched through a mask plate, the mask plate including:
    a non-transparent area, which has an intermediate vertical trunk, an intermediate horizontal trunk, and branches extending from the intermediate vertical trunk and the intermediate horizontal trunk, the intermediate vertical trunk and the intermediate horizontal trunk forming angles with the branches, respectively; and
    a transparent area, which has a first transparent portion provided between the branches,
    wherein the first transparent portion is provided with an optical interference unit, which is used for processing light with a first intensity into light with a second intensity, the first intensity being higher than the second intensity.

13. The array substrate of claim 12, wherein the transparent area of the mask plate further has a second transparent portion, which is used for directly introducing light with the first intensity to form a contact bole on the array substrate to be formed through the mask plate.

14. The array substrate of claim 13, wherein the optical interference unit is in the form of a grid, a grate, or a sheet.

15. The array substrate of claim 14, wherein the optical interference unit is arranged in a middle position of the first transparent portion and penetrates the first transparent portion.

16. The array substrate of claim 12, wherein the optical interference unit is made of a non-transparent or semi-transparent material.

17. The array substrate of claim 12, wherein the insulation structure has an intermediate vertical trunk, an intermediate horizontal trunk, and branches extending from the intermediate vertical trunk and the intermediate horizontal trunk, the intermediate vertical trunk and the intermediate horizontal trunk forming angles with the branches, respectively, and a groove having a bottom surface made of an insulation material is provided between two adjacent branches.

18. The array substrate of claim 17, wherein a shielding electrode is further provided between a data line and the pixel electrode in the same layer with a gate line, so as to shield electric signals between the data line and the pixel electrode.

* * * * *